(12) United States Patent
Hopper et al.

(10) Patent No.: US 6,933,562 B1
(45) Date of Patent: Aug. 23, 2005

(54) POWER TRANSISTOR STRUCTURE WITH NON-UNIFORM METAL WIDTHS

(75) Inventors: Peter J. Hopper, San Jose, CA (US); Philipp Lindorfer, San Jose, CA (US); Vladislav Vashchenko, Palo Alto, CA (US); Andy Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/609,191

(22) Filed: Jun. 27, 2003

(51) Int. Cl.[7] .................. H01L 29/46; H01L 29/94; H01L 31/62; H01L 31/113; H01L 31/119
(52) U.S. Cl. .................. 257/341; 257/368; 257/382
(58) Field of Search ........................ 257/341–346, 257/368, 382–412

(56) References Cited

U.S. PATENT DOCUMENTS

| | | | |
|---|---|---|---|
| 6,084,277 A | 7/2000 | Disney et al. | 257/401 |
| 6,555,883 B1 | 4/2003 | Disney et al. | 257/401 |
| 6,728,942 B2 * | 4/2004 | Lampaert et al. | 716/10 |
| 6,750,489 B1 | 6/2004 | Merrill | 257/292 |

* cited by examiner

*Primary Examiner*—Cuong Nguyen
(74) *Attorney, Agent, or Firm*—Mark C. Pickering

(57) ABSTRACT

A power transistor structure uses metal drain and source strips with non-uniform widths to reduce variations in current density across the power transistor structure. The reductions in current density, in turn, reduce the source-to-drain turn on resistance and maximize the overall current carrying capacity of power transistor structure.

20 Claims, 10 Drawing Sheets ial 110. The n+ strips 112, in
POWER TRANSISTOR STRUCTURE WITH NON-UNIFORM METAL WIDTHS

DETAILED DESCRIPTION OF THE INVENTION

Figure 1A:
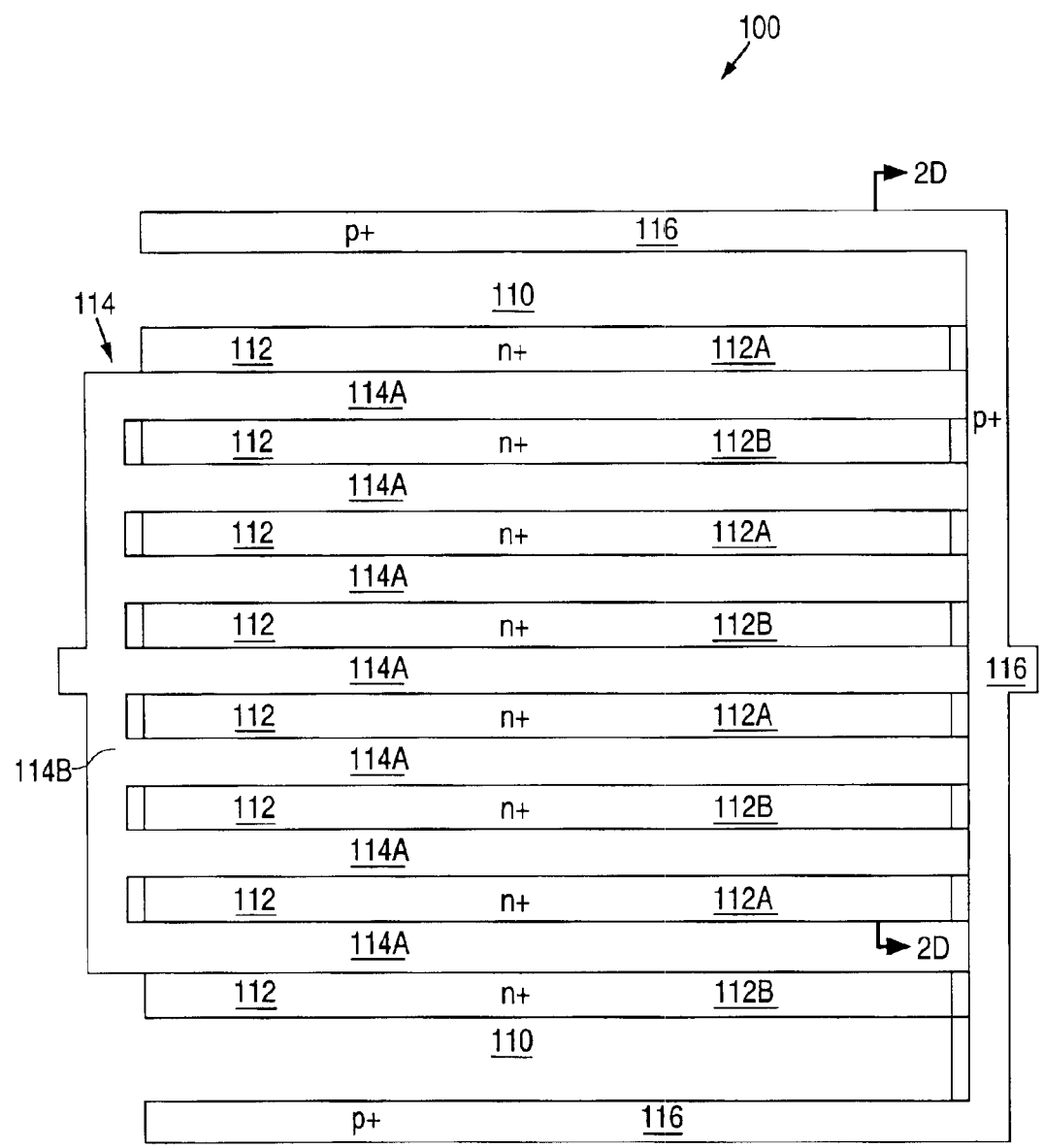
FIGS. 1A–1C are a series of plan views illustrating an example of a power transistor structure 100 in accordance with the present invention.
Figure 1B:
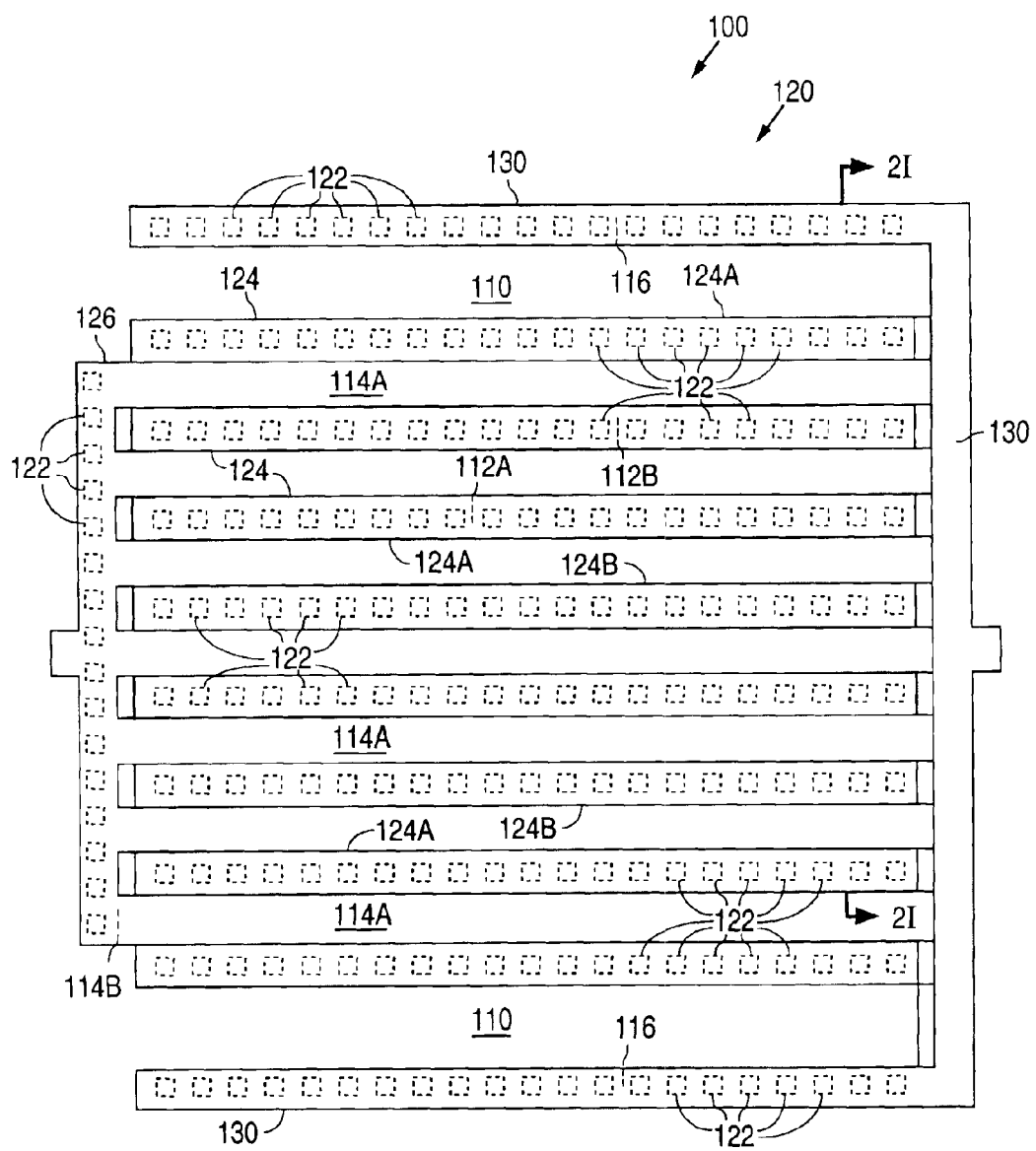
Figure 1C:
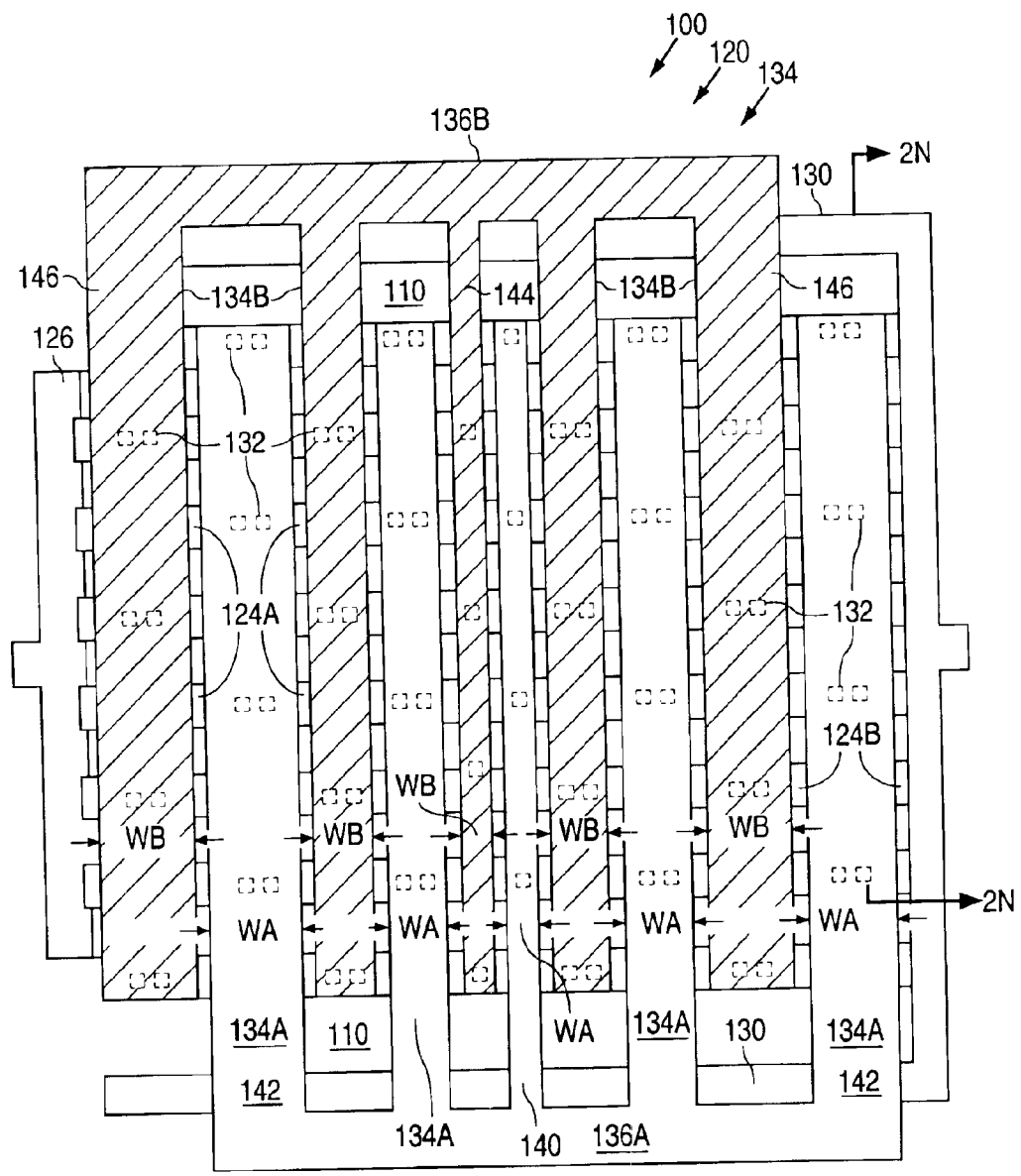

FIGS. 1A–1C show a series of plan views that illustrate an example of a power transistor structure 100 in accordance with the present invention. As described in greater detail below, structure 100 provides a more even current density, thereby reducing the source-to-drain turn on resistance, by using metal lines with non-uniform widths.

As shown in FIG. 1A, power transistor structure 100, which is formed in a p-type semiconductor material 110, such as a well, includes a number of n+ strips 112 that are formed in semiconductor material 110. The n+ strips 112, in turn, include alternating drain strips 112A and source 112B strips.

As further shown In the FIG. 1A, power transistor structure 100 also includes a gate structure 114 that is formed over, and insulated from, semiconductor material 110. Gate structure 114 Includes a number of gate strips 114A that are formed between the n+ strips 112, and a gate connector 114B that is connected to an end of each of the gate strips 114A.

In addition, power transistor structure 100 includes a number of p+ strips 116 that are formed in semiconductor material 110. In the FIG. 1A example, two horizontal p+ strips 116 and a vertical p+ strip 116 are shown where the vertical p+ strip 116 contacts an end of the horizontal p+ strips 116.

As shown in FIG. 1B, power transistor structure 100 further includes an interconnect structure 120 that Is formed over semiconductor material 110. Interconnect structure 120, in turn, includes a number of contacts 122 that are connected to the n+ strips 112, the gate connector 114B, and the p+ strips 116.

Interconnect structure 120 also includes a number of metal-1 strips 124 that are formed over, and Insulated from, semiconductor material 110. The metal-1 strips 124, in turn, include alternating metal drain strips 124A that are connected to the contacts 122 which are connected to the n+ drain strips 112A, and metal-1 source strips 124B that are connected to the contacts 122 which are connected to the n+ source strips 112B.

In addition, interconnect structure 120 includes a metal-1 strip 126 that is formed over, and insulated from, semiconductor material 110. The metal-1 strip 126 is connected to the contacts 122 which are connected to the gate connector 114B. Interconnect structure 120 further includes a number of metal-1 strips 130 that are formed over, and insulated from, semiconductor material 110. The metal-1 strips 130 are connected to the contacts 122 which are connected to the p+ strips 116.

As shown in FIG. 1C, interconnect structure 120 further includes a number of vias 132 that are connected to the metal-1 drain and source strips 124A and 124B. As additionally shown in FIG. 1C, power transistor structure 100 includes a metal structure 134 that is formed over interconnect structure 120.

Metal structure 134, in turn, includes alternating metal-2 drain strips 134A that are connected to the vias 132 which are connected to the metal-1 drain strips 124A, and metal-2 source strips 134B that are connected to the vias 132 which are connected to the metal-1 source strips 124B. In addition, metal structure 134 includes a drain connector 136A that is connected to an end of each drain strip 134A, and a source connector 136B that is connected to an end of each source strip 136B.

In accordance with the present invention, the metal-2 drain strips 134A have widths WA that are non-uniform. In the example shown in FIGS. 1A–1C, the metal-2 drain strips 134A include a center metal-2 strip 140 and outer metal-2 strips 142 where the widths WA of the metal-2 drain strips 134A increase from the center metal-2 strip 140 to the outer metal-2 strips 142.

Similarly, the metal-2 source strips 134B have widths WB that are non-uniform. In the example shown in FIGS. 1A–1C, the metal-2 source strips 134B include a center metal-2 strip 144 and outer metal-2 strips 146 where the widths WB of the metal-2 source strips 134B increase from the center metal-2 strip 144 to the outer metal-2 strips 146. In addition, center metal-2 strip 140 and center metal-2 strip 144 have equal widths, although non-equal widths can also be used.

One of the advantages of using metal-2 drain and source strips with non-uniform widths is that the widths of the metal-2 drain and source strips can be sized to reduce variations in current density across the structure. This, In turn, reduces the source-to-drain turn on resistance and maximizes the overall current carrying capacity of power transistor structure 100.

If the variation in current density across a power transistor structure is large, then the areas that carry a higher current density are more prone to overheating or hot electron degradation, and hence provide the limit for safe operation. As a result, by reducing variations in the current density across the power transistor structure, the overall current carrying capacity of power transistor structure can be increased.

Although the example shown in FIGS. 1A–1C shows metal-2 drain and source strips that increasingly get wider as the drain and source strips move towards the periphery, other combinations can also be used depending on the variations in current density of the power transistor structure.

For example, the metal-2 strips can get increasingly narrower as the strips move towards the periphery. In addition, the metal-2 strips can be formed in groups where each group includes a number of metal-2 strips. In this case, one group of metal-2 strips can have a first width, while another group of metal-2 strips can have a second different width. Further, although the present invention has been illustrated with metal-2 strips, metal strips formed from other metal layers can also be used.

Figure 2A:
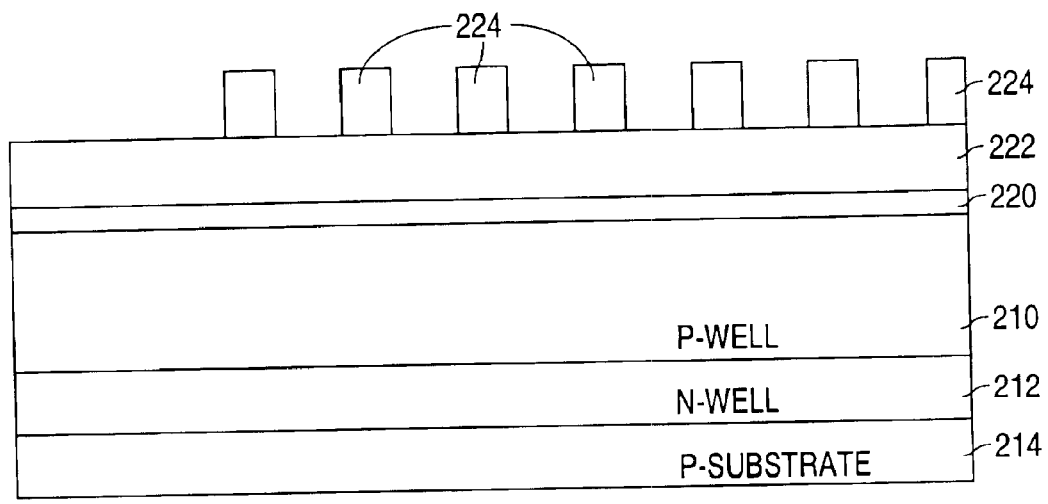
FIGS. 2A–2N are a series of cross-sectional diagrams illustrating an example of a method of forming a transistor structure in accordance with the present invention.
Figure 2B:
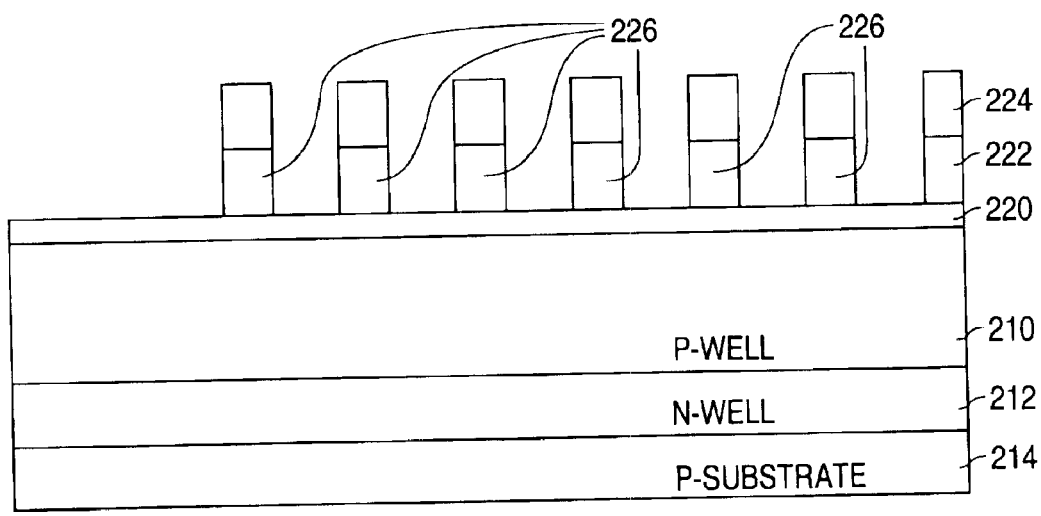
Figure 2C:
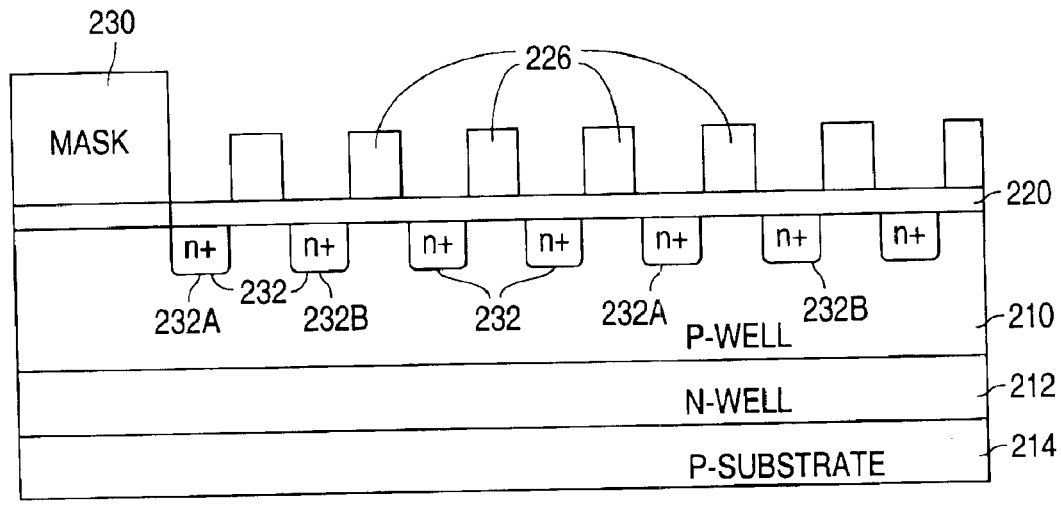
Figure 2D:
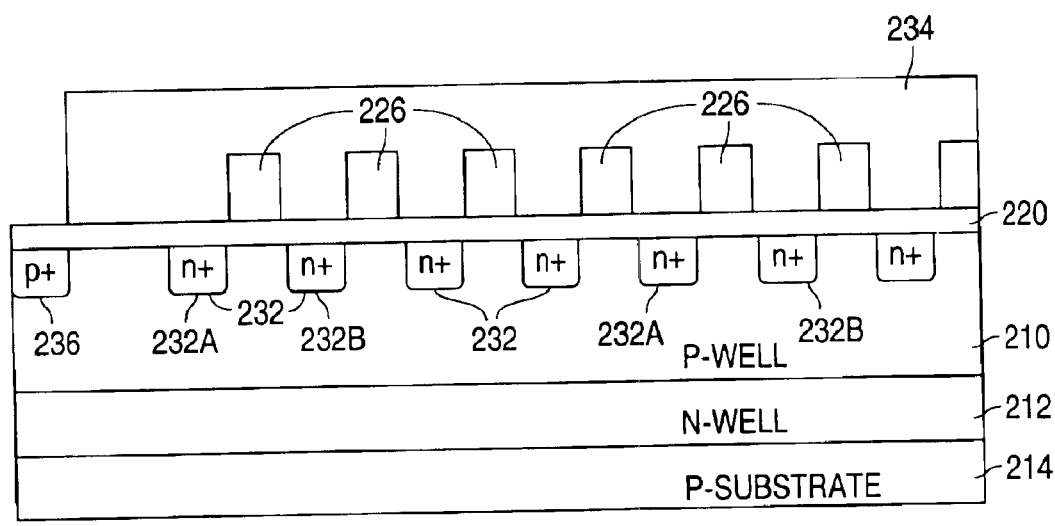
Figure 2E:
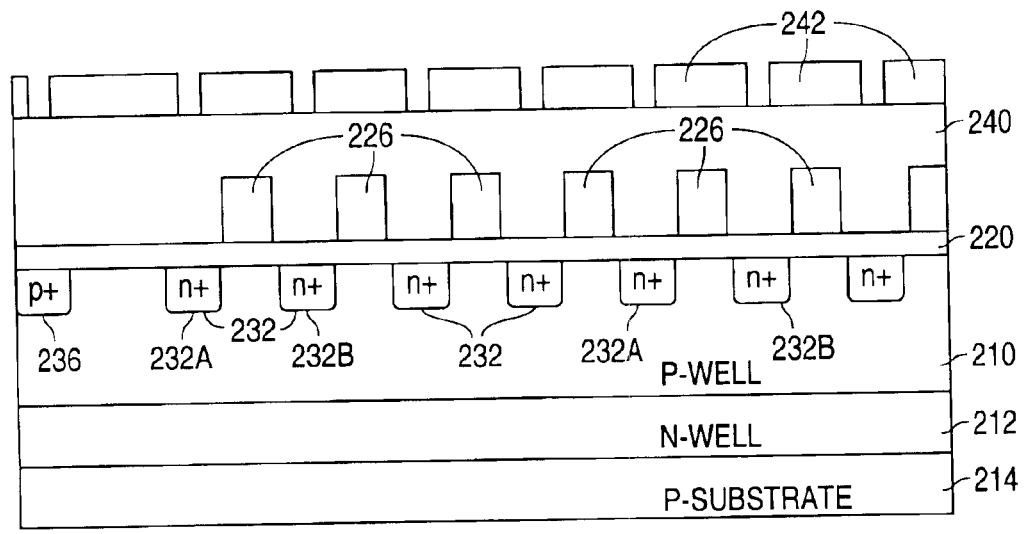
Figure 2F:
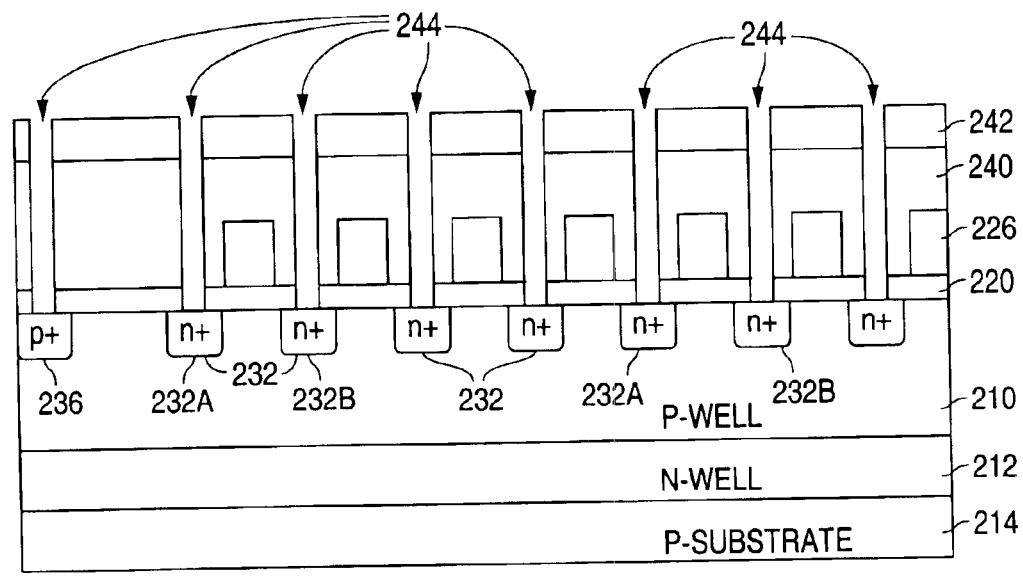
Figure 2G:
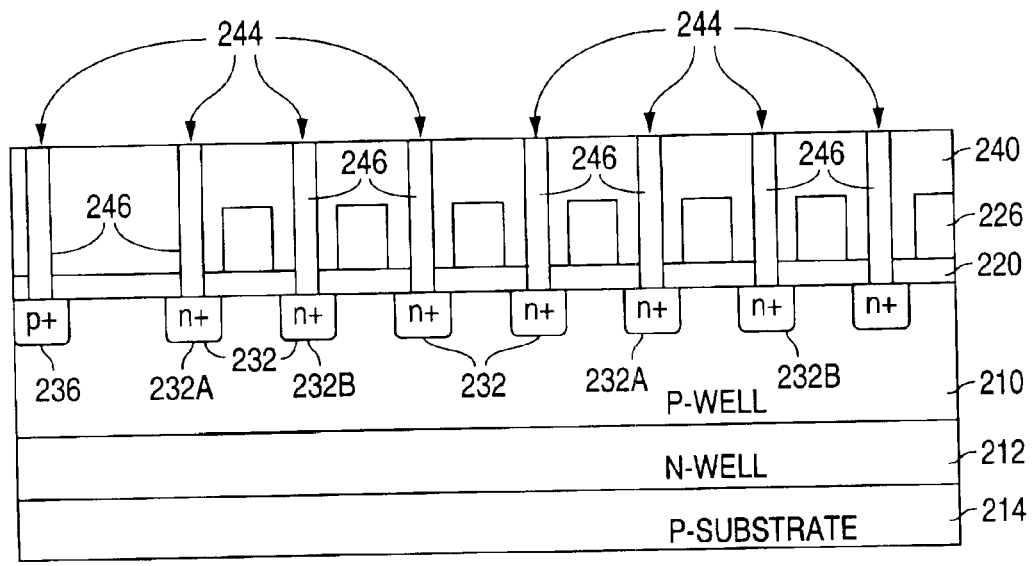
Figure 2H:
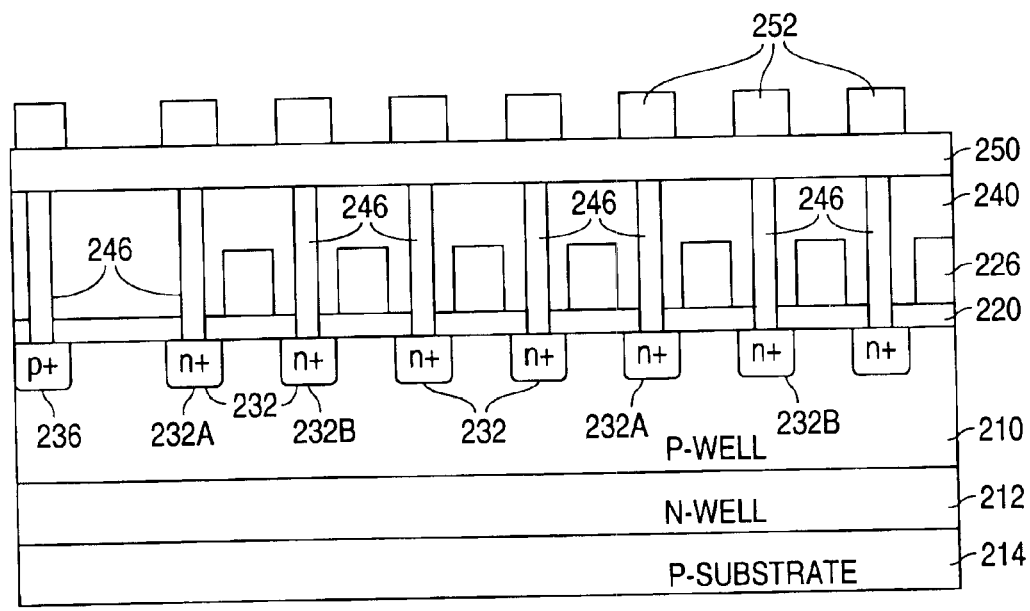
Figure 2I:
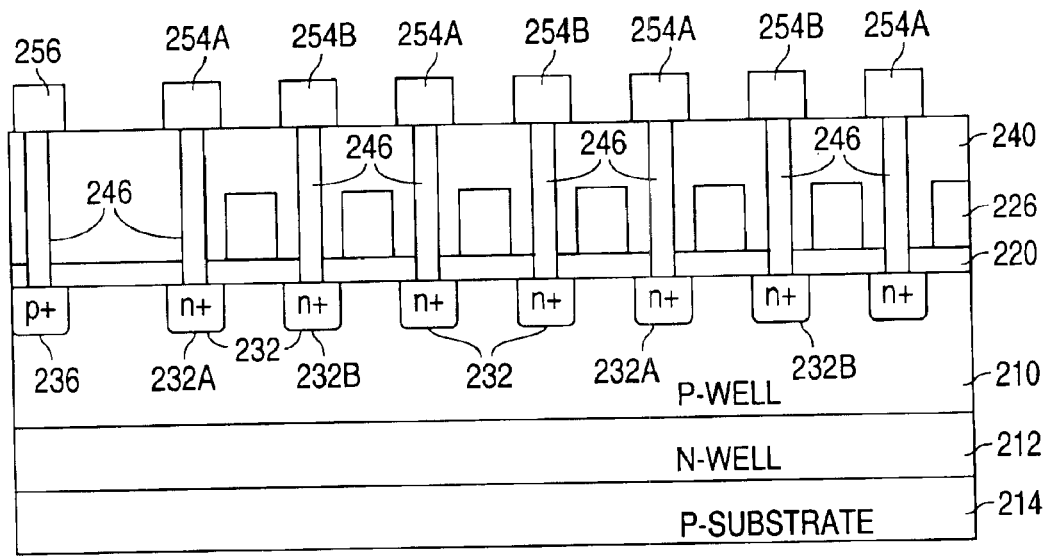
Figure 2J:
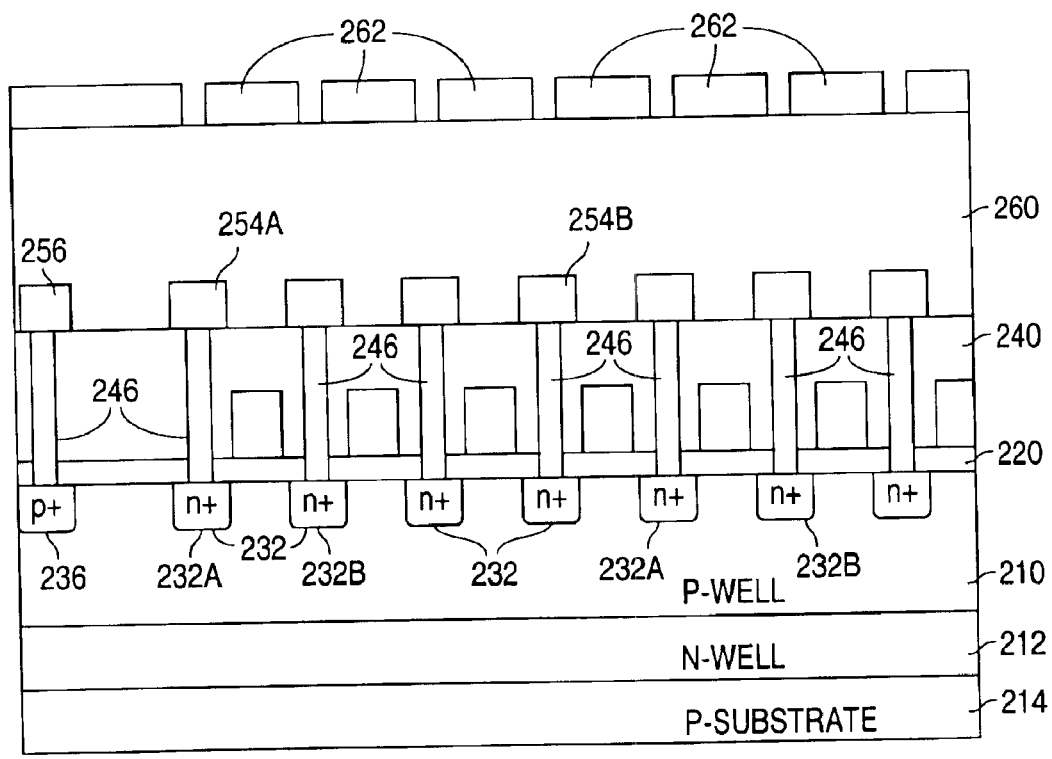
Figure 2K:
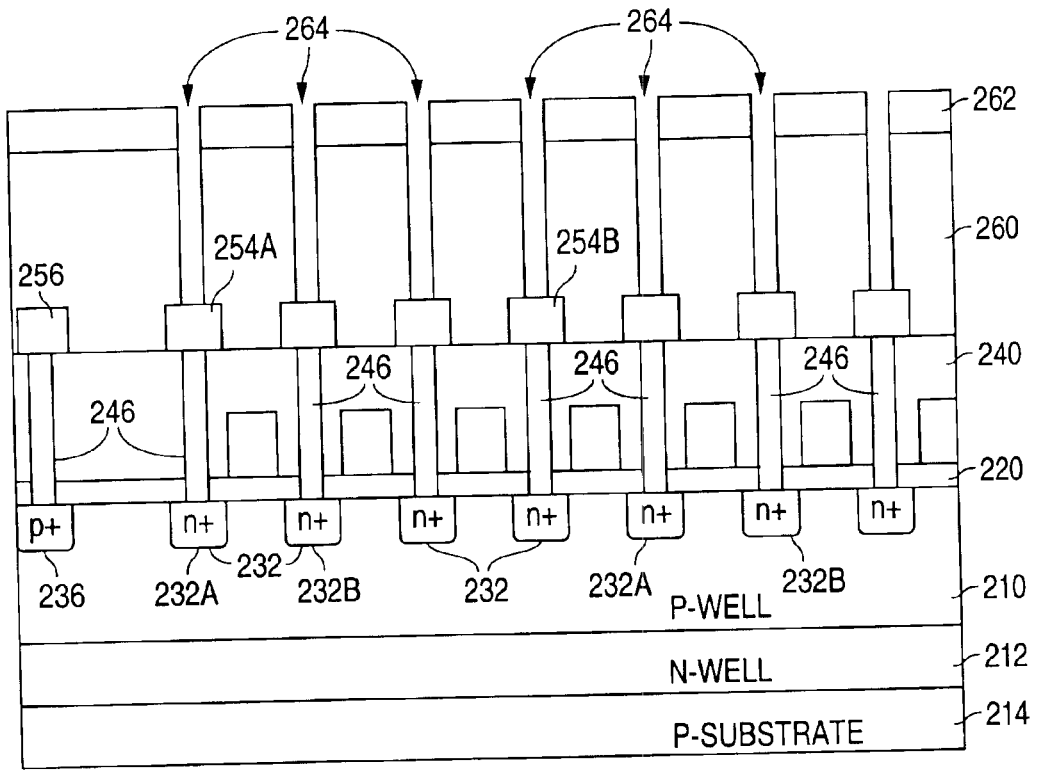
Figure 2L:
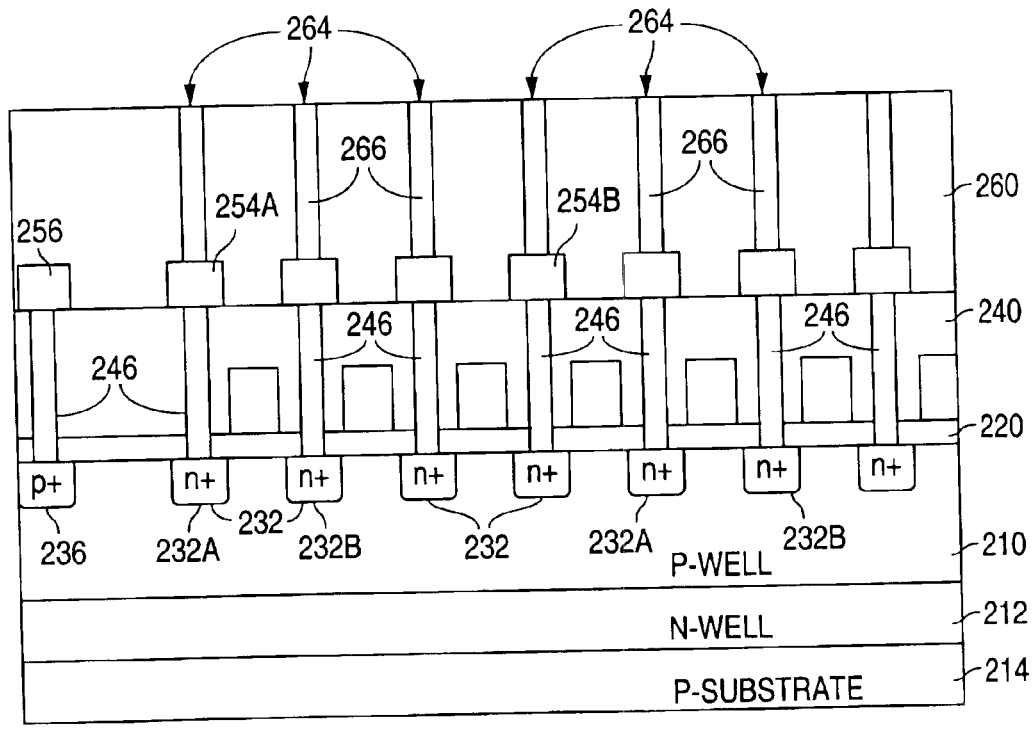
Figure 2M:
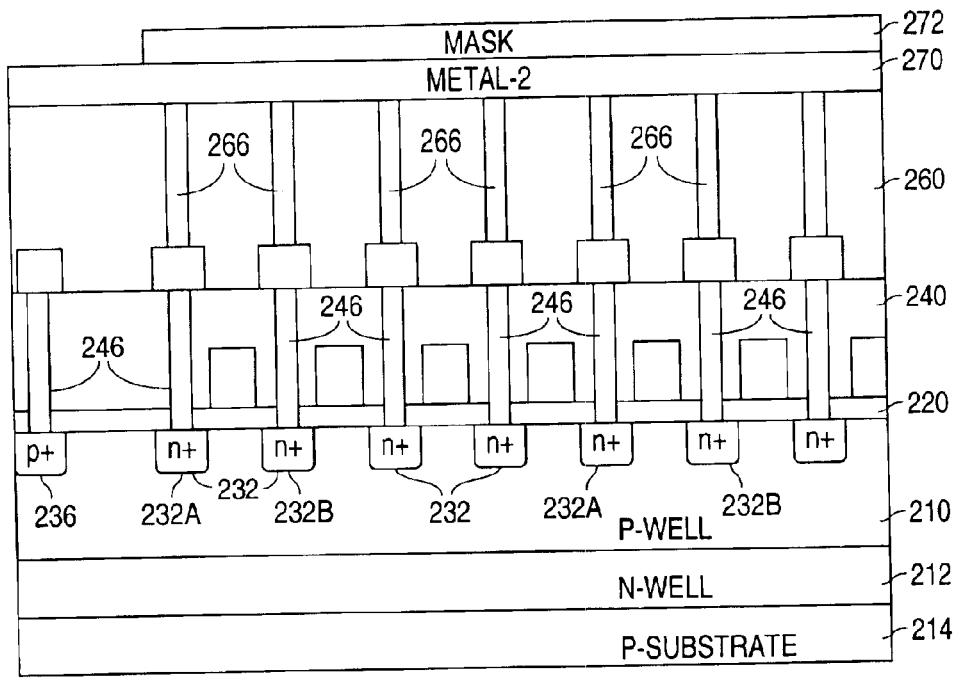
Figure 2N:
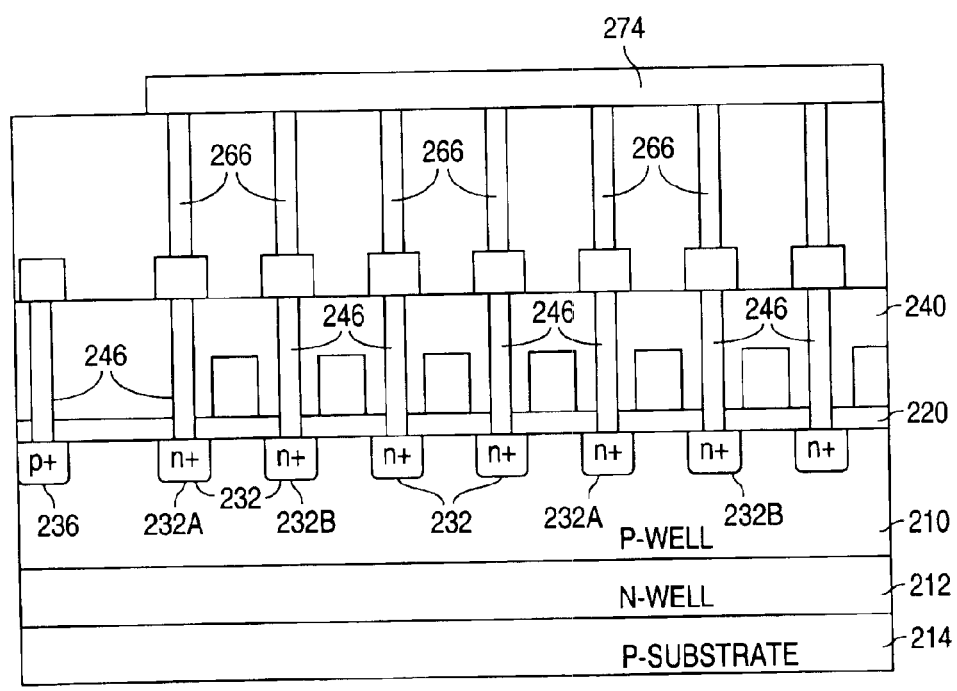

FIGS. 2A–2N show a series of cross-sectional diagrams that illustrate an example of a method of forming a power transistor structure in accordance with the present invention. As shown in FIG. 2A, the method, which utilizes a p-well 210 that is formed in an n-well 212 which, in turn, is formed in a p-type substrate 214, begins by forming a layer of gate oxide 220 on p-well 210. Alternately, p-well 210 can be directly formed in a p-type substrate. (Conventional steps can be used to set the threshold voltage of the to-be-formed transistor structure.)

After gate oxide layer 220 has been formed, a layer of polysilicon 222 is formed on gate oxide layer 220. Next, a gate mask 224 is formed and patterned on polysilicon layer 222. Following this, as shown in FIG. 2B, the exposed regions of polysilicon layer 222 are etched to form a gate structure that includes a number of spaced-apart polysilicon gate strips 226, and a gate connector that is connected to an end of each of the gate strips 226. Once the etch is complete, gate mask 224 is removed.

Next, as shown in FIG. 2C, an implant mask 230 is formed and patterned on p-well 210 to expose the gate structure and adjacent regions of p-well 210. Following this, an n-type dopant, such as phosphorous, is implanted into p-well 210 and the gate structure to form a number of n+ strips 232 and dope the gate structure, including the gate strips 226 and the gate connector. The n+ strips 232, in turn, include alternating drain strips 232A and source 232B strips. Once the implant is complete, implant mask 230 is removed.

As shown in FIG. 2D, after implant mask 230 has been removed, an implant mask 234 is formed and patterned on p-well 210 to protect the gate structure and the n+ strips 232. Following this, a p-type dopant, such as boron, is implanted into p-well 210 to form a number of connected p+ strips 236. Once the implant is complete, implant mask 234 is removed.

FIG. 1A shows the structure that results following the removal of mask 234, where FIG. 2D is taken along lines 2D—2D of FIG. 1A, n+ strips 232 represent n+ strips 112, the gate structure with gate strips 226 and the gate connector represents gate structure 114 with gate strips 114A and gate connector 114B, and the p+ strips 236 represent p+ strips 116.

As shown in FIG. 2E, after implant mask 234 has been removed, a layer of isolation material 240 is formed on gate oxide layer 220 and the gate structure. Once formed, isolation layer 240 is planarized using conventional methods. Following this, a contact mask 242 is formed and patterned on isolation layer 240 to expose regions on the top surface of isolation layer 240 that lie over the n+ strips 232, the p+ strips 236, and a portion of the gate structure.

Following this, as shown in FIG. 2F, the exposed regions of isolation layer 240 and the underlying layer of gate oxide 220 are then etched to form contact openings 244 that expose regions on the surfaces of the n+ strips 232, the p+ strips 236, and a portion of the gate structure. Once the etch is complete, contact mask 242 is removed.

Once contact mask 242 has been removed, a layer of contact metal is formed on isolation layer 240 to fill up the contact openings 244. (A diffusion barrier can be formed on the exposed n+ and p+ strips using conventional methods. In addition, contact openings to the gate structure can be formed in a separate set of masking and etching steps.)

As shown in FIG. 2G, after the layer of contact metal has been formed, the layer of contact metal is planarized using conventional methods to remove the layer of contact metal from the top surface of isolation layer 240. The polarization step forms contacts 246 in the contact openings 244 that make electrical connections with the n+ drain and source strips 232A and 232B, the p+ strips 236, and the gate connector of the gate structure.

After this, as shown in FIG. 2H, a layer of metal-1 250 is formed on isolation layer 240 and the contacts 246 to make electrical connections with the contacts 246. Next, a metal-1 mask 252 is formed and patterned on metal-1 layer 250. As shown in FIG. 2I, the exposed regions of metal-1 layer 250 are etched until the exposed regions of metal-1 layer 250 have been removed from the top surface of isolation layer 240.

As further shown in FIG. 2I, the etch forms alternating metal-1 drain strips 254A, which are connected to the contacts 246 that are connected to the n+ drain strips 232A, and metal-1 source strips 254B, which are connected to the contacts 246 that are connected to the n+ source strips 232B.

The etch also forms a metal-1 gate strip that is connected to the contacts 246 which are connected to the gate connector of the gate structure, and metal-1 strips 256 that are connected to the contacts 246 which are connected to the p+ strips 236. Once the etch is complete, metal-1 mask 252 is removed.

FIG. 1B shows the structure that results following the removal of mask 252, where FIG. 2I is taken along lines 2I—2I of FIG. 1B, contacts 246 represent contacts 122, metal-1 drain and source strips 254A and 254B represent metal-1 drain and source strips 124A and 124B, the metal-1 gate strip represents metal-1 gate strip 126, and metal-1 strips 256 represent metal-1 strips 130.

As shown in FIG. 2J, after metal-1 mask 252 has been removed, a layer of isolation material 260 is formed on isolation layer 240, metal-1 strips 254A and 254B, metal-1 strips 256, and the metal-1 gate strip formed over, and electrically connected to, the gate connector of the gate structure.

Once isolation layer 260 has been formed, isolation layer 260 is planarized using conventional methods. Following this, a via mask 262 is formed and patterned on isolation layer 260 to expose regions on the top surface of isolation layer 260 that lie over the metal-1 drain and source strips 254A and 254B.

Following this, as shown in FIG. 2K, the exposed regions of isolation layer 260 are then etched to form via openings 264 that expose regions on the surfaces of the metal-1 drain and source strips 254A and 254B. Once the etch is complete, via mask 262 is removed. Next, a layer of via metal is formed on isolation layer 260 to fill up the contact openings 264.

As shown in FIG. 2L, after the layer of via metal has been formed, the layer of via metal is planarized using conventional methods to remove the layer of via metal from the top surface of isolation layer 260. The planarization step forms vias 266 in the contact openings 264 that make electrical connections with the metal-1 drain and source strips 254A and 254B.

After this, as shown in FIG. 2M, a layer of metal-2 270 is formed on isolation layer 260 and the vias 266 to make electrical connections with the vias 266. Next, a metal-2 mask 272 is formed and patterned on metal-2 layer 270. As shown in FIG. 2N, the exposed regions of metal-2 layer 270 are then etched until the exposed regions of metal-2 layer 270 have been removed from the top surface of isolation layer 260.

As further shown in FIG. 2N, the etch forms a drain structure with spaced-apart metal-2 drain strips 274 and a drain connector that is connected to an end of each drain strip 274. The metal-2 drain strips, in turn, are connected to the vias 266 that are connected to the metal-1 drain strips 254A.

The etch also forms a source structure with spaced-apart metal-2 source strips, and a source connector that is connected to an end of each source strip. The source strips, in turn, are connected to the vias 266 that are connected to the metal-1 source strips 254B. Once the etch is complete, metal-2 mask 272 is removed. Following this, the method continues with conventional back end processing steps.

FIG. 1C shows the structure that results following the removal of mask 272, where FIG. 2N is taken along lines 2N—2N of FIG. 1C, the vias 266 represent the vias 132, the metal-2 drain strips 274 represent the metal-2 drain strips 134A, the metal-2 drain connector represents the metal-2 drain connector 136A, the metal-2 source strips represent the metal-2 source strips 134B, and the metal-2 source connector represents the metal-2 source connector 136B.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A transistor structure formed in a semiconductor material of a first conductivity type, the semiconductor material having a top surface, the transistor structure comprising:

a plurality of spaced-apart second conductivity strips formed in the semiconductor material, the plurality of second conductivity strips including alternating drain and source strips;

a plurality of spaced-apart gate strips formed over the semiconductor material between the second conductivity strips; and a metal structure formed directly over the plurality of second conductivity strips, the metal structure including a plurality of spaced-apart first metal strips that are electrically connected to the drain strips, the plurality of first metal strips having widths, lengths, and thicknesses such that each first metal strip has a width, a length that is substantially longer than the width, and a thickness measured normal to the top surface of the semiconductor material, the widths of the first metal strips being different.

2. A transistor structure formed in a semiconductor material of a first conductivity type, the transistor structure comprising:

a plurality of second conductivity strips formed in the semiconductor material, the plurality of second conductivity strips including alternating drain and source strips;

a plurality of gate strips formed over the semiconductor material between the second conductivity strips;

an interconnect structure formed over the plurality of second conductivity strips and the plurality of gate strips, the interconnect structure being electrically connected to the second conductivity strips; and a metal structure formed over the interconnect structure, the metal structure including a plurality of first metal strips that are electrically connected to the drain strips, the plurality of first metal strips having widths, lengths, and thicknesses such that each first metal strip has a width, a length, and a thickness, the widths of the first metal strips being different.

3. The transistor structure of claim 2 wherein:

the plurality of first metal strips include a first center metal strip and a first outer metal strip, and the widths of the first metal strips increase from the first center metal strip to the first outer metal strip.

4. The transistor structure of claim 2 wherein the metal structure further includes a first metal connector, the plurality of first metal strips contacting the first metal connector and extending away from the first metal connector.

5. The transistor structure of claim 2 wherein each first metal strip is electrically connected to each drain strip.

6. The transistor structure of claim 2 wherein the metal structure further includes a plurality of second metal strips formed between the plurality of first metal strips, the plurality of second metal strips being electrically connected to the source strips, the plurality of second metal strips having widths, lengths, and thicknesses such that each second metal strip has a width, a length, and a thickness.

7. The transistor structure of claim 6 wherein the widths of the second metal strips are different.

8. The transistor structure of claim 7 wherein:

the plurality of second metal strips include a second center metal strip and a second outer metal strip, and the widths of the second metal strips increase from the second center metal strip to the second outer metal strip.

9. The transistor structure of claim 7 wherein the metal structure further includes a second metal connector, the plurality of second metal strips contacting the second metal connector and extending away from the second metal connector.

10. The transistor structure of claim 7 wherein each second metal strip is electrically connected to each source strip.

11. The transistor structure of claim 3 wherein the metal structure further includes a plurality of second metal strips formed between the plurality of first metal strips, the plurality of second metal strips being electrically connected to the source strips, the plurality of second metal strips having widths, lengths, and thicknesses such that each second metal strip has a width, a length, and a thickness.

12. The transistor structure of claim 11 wherein the widths of the second metal strips are different.

13. The transistor structure of claim 11 wherein:

the plurality of second metal strips include a second center metal strip and a second outer metal strip, and the widths of the second metal strips increase from the second center metal strip to the second outer metal strip.

14. The transistor structure of claim 13 wherein the first center metal strip and the second center metal strip have equal widths.

15. The transistor structure of claim 1 wherein:

the plurality of first metal strips include a first center metal strip and a first outer metal strip, and the widths of the first metal strips vary from the first center metal strip to the first outer metal strip.

16. The transistor structure of claim 15 wherein the first metal strips lie orthogonal with respect to the plurality of second conductivity strips.

17. The transistor structure of claim 15 wherein the plurality of second conductivity strips are substantially parallel to each other, and the plurality of first metal strips are substantially parallel to each other.

18. The transistor structure of claim 15 wherein the metal structure further includes a first metal connector, the plurality of first metal strips contacting the first metal connector and extending away from the first metal connector.

19. The transistor structure of claim 15 wherein the metal structure further includes a plurality of spaced-apart second metal strips formed between and spaced apart from the plurality of first metal strips such that a second metal strip lies between each adjacent pair of first metal strips, the plurality of second metal strips being electrically connected to the source strips, the plurality of second metal strips having widths, lengths, and thicknesses such that each second metal strip has a width, a length that is substantially longer than a second metal strip width, and a thickness measured normal to the top surface of the semiconductor material, the widths of the second metal strips being different.

20. The transistor structure of claim 19 wherein:

the plurality of second metal strips include a second center metal strip and a second outer metal strip, and the widths of the second metal strips vary from the second center metal strip to the second outer metal strip.

* * * * *

UNITED STATES PATENT AND TRADEMARK OFFICE
CERTIFICATE OF CORRECTION

PATENT NO. : 6,933,562 B1
DATED : August 23, 2005
INVENTOR(S) : Hopper et al.

It is certified that error appears in the above-identified patent and that said Letters Patent is hereby corrected as shown below:

Column 1,
Line 28, delete "In" and replace with -- in --.
Line 31, delete "Includes" and replace with -- includes --.
Line 41, delete "Is" and replace with -- is --.
Line 47, delete "Insulated" and replace with -- insulated --.

Column 2,
Line 32, delete "In" and replace with -- in --.

Column 3,
Line 55, delete "polarization" and replace with -- planarization --.

Signed and Sealed this

Eleventh Day of October, 2005

JON W. DUDAS
*Director of the United States Patent and Trademark Office*